(12) United States Patent
Liu et al.

(10) Patent No.: US 12,356,718 B2
(45) Date of Patent: Jul. 8, 2025

(54) DISPLAY SUBSTRATE, DISPLAY DEVICE AND MANUFACTURING METHOD OF THE DISPLAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaona Liu, Beijing (CN); Jianjun Wang, Beijing (CN); Weitao Chen, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/779,193

(22) PCT Filed: Jun. 29, 2021

(86) PCT No.: PCT/CN2021/103056
§ 371 (c)(1),
(2) Date: May 24, 2022

(87) PCT Pub. No.: WO2023/272480
PCT Pub. Date: Jan. 5, 2023

(65) Prior Publication Data
US 2024/0170496 A1 May 23, 2024

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136286* (2013.01); *G02F 1/1368* (2013.01);
(Continued)

(58) Field of Classification Search
CPC ............ G02F 1/1368; G02F 1/136286; G02F 1/134309; G02F 1/13439; G02F 1/134372;
(Continued)

(56) References Cited

U.S. PATENT DOCUMENTS 8,045,112 B2 * 10/2011 Lee ................... G02F 1/133707
349/129
2003/0128323 A1 * 7/2003 Matsumoto ....... G02F 1/134363
349/141
(Continued)

FOREIGN PATENT DOCUMENTS

CN 102945827 A 2/2013
CN 103852942 A 6/2014
(Continued)

*Primary Examiner* — Mouloucoulaye Inoussa
(74) *Attorney, Agent, or Firm* — BROOKS KUSHMAN P.C.

(57) ABSTRACT

A display substrate, a display device and a manufacturing method thereof. The display substrate includes a base substrate, and a gate electrode layer, a gate insulation layer, an active layer and a source/drain metal layer laminated one on another on the base substrate. The display substrate further includes a first insulation layer arranged between the gate insulation layer and the second insulation layer and a second electrode layer arranged at a side of the second insulation layer away from the base substrate. The second electrode layer includes a second electrode pattern, the source/drain metal layer includes a data line pattern, an orthogonal projection of the first electrode layer onto the base substrate partially overlaps an orthogonal projection of the second electrode pattern onto the base substrate, and the first electrode layer or the second electrode pattern is electrically coupled to the data line pattern.

13 Claims, 11 Drawing Sheets

(51) Int. Cl.
*G02F 1/1368* (2006.01)
*H10D 86/01* (2025.01)
*H10D 86/40* (2025.01)

(52) U.S. Cl.
CPC ......... *H10D 86/021* (2025.01); *H10D 86/441* (2025.01); *H10D 86/451* (2025.01)

(58) Field of Classification Search
CPC ......... G02F 1/134363; G02F 1/133707; G02F 1/133738; G02F 1/133548; G02F 1/134318; G02F 1/136209; G02F 1/136218; G02F 1/133512; G02F 1/136227; G02F 1/133345; G02F 1/133776; G02F 1/133761; G02F 2201/122; G02F 2201/123; G02F 2201/128; G02F 2201/121; G02F 2201/50; G09G 3/36; H01L 27/124; H01L 27/1259; H01L 27/1248; H01L 23/552
See application file for complete search history.

(56) References Cited

U.S. PATENT DOCUMENTS

| | | | | |
|---|---|---|---|---|
| 2007/0109455 | A1* | 5/2007 | Kim | G02F 1/134309 349/43 |
| 2009/0207365 | A1* | 8/2009 | Lee | G02F 1/134363 349/141 |
| 2010/0110358 | A1* | 5/2010 | Um | G02F 1/134363 349/141 |
| 2010/0165259 | A1* | 7/2010 | Nakanishi | G02F 1/134336 349/86 |
| 2011/0013129 | A1* | 1/2011 | Jeong | G02F 1/134336 349/141 |
| 2011/0199550 | A1* | 8/2011 | Fan | G02F 1/1395 349/33 |
| 2011/0199568 | A1* | 8/2011 | Morishita | G02F 1/134363 349/141 |
| 2012/0075542 | A1* | 3/2012 | Kim | G02F 1/133707 349/33 |
| 2012/0127067 | A1* | 5/2012 | Tseng | G02F 1/13624 345/87 |
| 2012/0169983 | A1 | 7/2012 | Ko et al. | |
| 2012/0218501 | A1* | 8/2012 | Lee | G02F 1/134309 349/139 |
| 2013/0077008 | A1* | 3/2013 | Kim | G02F 1/136227 349/42 |
| 2013/0229608 | A1* | 9/2013 | Lee | G02F 1/134309 349/138 |
| 2013/0293820 | A1* | 11/2013 | Lee | G02F 1/134309 349/143 |
| 2014/0009707 | A1* | 1/2014 | Jung | H01L 27/124 349/42 |
| 2014/0098317 | A1* | 4/2014 | Jung | G02F 1/13439 349/43 |
| 2014/0111728 | A1* | 4/2014 | Li | H01L 27/124 257/59 |
| 2014/0152934 | A1 | 6/2014 | Huh et al. | |
| 2015/0131037 | A1* | 5/2015 | Kim | G02F 1/133528 349/96 |
| 2015/0227014 | A1* | 8/2015 | Jung | G02F 1/133345 349/46 |
| 2015/0378226 | A1* | 12/2015 | Yoshimoto | G02F 1/134309 438/30 |
| 2016/0004130 | A1 | 1/2016 | Hirota et al. | |
| 2016/0306211 | A1* | 10/2016 | Lee | G02F 1/13439 |
| 2016/0313622 | A1* | 10/2016 | Duan | G02F 1/1368 |
| 2017/0003555 | A1* | 1/2017 | Umeda | G02F 1/134363 |
| 2017/0031215 | A1* | 2/2017 | Yang | G02F 1/133707 |
| 2017/0068137 | A1* | 3/2017 | Shin | G02F 1/1362 |
| 2017/0131596 | A1* | 5/2017 | Xie | G02F 1/133514 |
| 2017/0146861 | A1* | 5/2017 | Takeshita | G02F 1/134363 |
| 2017/0192280 | A1* | 7/2017 | Kwak | G02F 1/136209 |
| 2017/0199438 | A1 | 7/2017 | Liu et al. | |
| 2017/0219887 | A1* | 8/2017 | Deng | G02F 1/136286 |
| 2017/0373098 | A1* | 12/2017 | Hirano | H01L 27/124 |
| 2018/0107079 | A1* | 4/2018 | Tae | G09G 3/3659 |
| 2018/0210292 | A1* | 7/2018 | Liu | G02F 1/13439 |
| 2019/0346711 | A1* | 11/2019 | Yeh | G02F 1/136213 |
| 2020/0144296 | A1* | 5/2020 | Choi | H01L 23/552 |
| 2020/0150496 | A1* | 5/2020 | Woo | G02F 1/133707 |
| 2021/0223647 | A1* | 7/2021 | Wang | G02F 1/136209 |
| 2022/0308406 | A1* | 9/2022 | Liu | G02F 1/134309 |
| 2024/0036423 | A1* | 2/2024 | Liu | G02F 1/136227 |

FOREIGN PATENT DOCUMENTS

| | | |
|---|---|---|
| CN | 106383423 A | 2/2017 |
| CN | 106950765 A | 7/2017 |
| CN | 111341814 A | 6/2020 |
| CN | 111402832 A | 7/2020 |
| JP | 2009025639 A | 2/2009 |
| JP | 2016014779 A | 1/2016 |
| KR | 20110050038 A | 5/2011 |

\* cited by examiner

DISPLAY SUBSTRATE, DISPLAY DEVICE AND MANUFACTURING METHOD OF THE DISPLAY SUBSTRATE

CROSS-REFERENCE TO RELATED APPLICATION

This application is the U.S. national phase of PCT Application No. PCT/CN2021/103056 filed on Jun. 29, 2021, which is incorporated herein by reference in its entirety.

TECHNICAL FIELD

The present disclosure relates to the field of display technology, in particular to a display substrate, a display device and a manufacturing method of the display substrate.

BACKGROUND

With the development of liquid crystal display technology, a liquid crystal display has been widely used as flat panel display. Currently, for the liquid crystal displays, there are various display panels, e.g., a Twisted Nematic (TN) display panel, an Advanced Dimension Switch (ADS) display panel, a High-Advanced Dimension Switch (RADS) display panel and an In-Plane Switch (IPS) display panel. These display panels have different driving modes and different display effects, as well as their own advantages.

SUMMARY

In one aspect, the present disclosure provides in some embodiments a display substrate, including a base substrate, and a gate electrode layer, a gate insulation layer, an active layer and a source/drain metal layer laminated one on another on the base substrate. The display substrate further includes a first insulation layer, a first electrode layer, a second insulation layer and a second electrode layer laminated one on another, the first insulation layer is located at a side close to the source/drain metal layer, a via hole is formed in the second insulation layer, and the first electrode layer is electrically coupled to the source/drain metal layer through the via hole.

In a possible embodiment of the present disclosure, the second electrode layer includes a connection member, an orthogonal projection of the connection member onto the base substrate covers an orthogonal projection of the via hole onto the base substrate, and the connection member is electrically coupled to the source/drain metal layer and the first electrode layer.

In a possible embodiment of the present disclosure, the orthogonal projection of the via hole onto the base substrate overlaps an orthogonal projection of the first electrode layer onto the base substrate at a first overlapping region, the orthogonal projection of the via hole onto the base substrate overlaps an orthogonal projection of the source/drain metal layer onto the base substrate at a second overlapping region, and the connection member is electrically coupled to the first electrode layer at the first overlapping region and electrically coupled to the source/drain metal layer at the second overlapping region.

In a possible embodiment of the present disclosure, a thickness of the first insulation layer is 100 nm to 300 nm.

In a possible embodiment of the present disclosure, a thickness of the second insulation layer is 200 nm to 800 nm.

In a possible embodiment of the present disclosure, a plurality of gate lines arranged parallel to each other in a first direction and a plurality of data lines arranged parallel to each other in a second direction are formed on the base substrate, a minimum region enclosed by two adjacent gate lines and two adjacent data lines is a pixel region, the second electrode layer includes a hollowed-out region, an orthogonal projection of the hollowed-out region onto the base substrate is located in the pixel region, the hollowed-out region includes a plurality of hollowed-out patterns arranged parallel to each other in a third direction, the first direction is perpendicular to the second direction, and the third direction intersects the first direction and the second direction.

In a possible embodiment of the present disclosure, the hollowed-out pattern includes a body member and a corner member, and the corner member is located on at least one of two sides of the pixel region close to the data line.

In a possible embodiment of the present disclosure, an angle between the corner member and an extension direction of the body member in the third direction is an acute angle within a range from 20° to 60°.

In a possible embodiment of the present disclosure, a width of the hollowed-out pattern is a first size, a distance between two adjacent hollowed-out patterns is a second size, and a ratio of the first size to the second size ranges from 1.5 to 3.

In a possible embodiment of the present disclosure, a linear distance between the body member and the corner member in the third direction is 2 µm to 6 µm.

In a possible embodiment of the present disclosure, the gate line is electrically coupled to the gate electrode layer, and the data line is electrically coupled to the source/drain metal layer.

In a possible embodiment of the present disclosure, each pixel region includes a first chip region and a second chip region arranged in the second direction, and the corner member of the hollowed-out pattern in the first chip region and the corner member of the hollowed-out pattern in the second chip region are arranged at sides of the pixel region close to different data lines respectively.

In another aspect, the present disclosure provides in some embodiments a display device including the above-mentioned display substrate.

In yet another aspect, the present disclosure provides in some embodiments a method for manufacturing a display substrate, including: providing a base substrate; forming a gate electrode layer, a gate insulation layer, an active layer and a source/drain metal layer on base the base substrate; forming a first electrode layer at a side of the source/drain metal layer away from the base substrate; forming a second insulation layer at a side of the first electrode layer away from the base substrate; forming a via hole in the second insulation layer, so as to expose a part of a surface of the first electrode layer away from the base substrate and expose a part of a surface of the source/drain metal layer away from the base substrate; and forming a second electrode layer at a side of the second insulation layer away from the base substrate, the second electrode layer including a connection member, and the connection member being electrically coupled to the first electrode layer and the source/drain metal layer through the via hole.

BRIEF DESCRIPTION OF THE DRAWINGS

In order to illustrate the technical solutions of the embodiment of the present disclosure in a clearer manner, the drawings desired for the embodiment of the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments a display substrate.

As shown in FIG. 1 to FIG. 14, in the embodiments of the present disclosure, the display substrate includes a base substrate 101, and a gate electrode layer 102, a gate insulation layer 103, an active layer 104 and a source/drain metal layer 105 laminated one on another on the base substrate 101. The display substrate further includes a first insulation layer 109, a first electrode layer 107, a second insulation layer 106, and a second electrode layer 108 laminated one on another in a direction away from the base substrate 101. The first insulation layer 109 is located at a side close to the source/drain metal layer 105. In other words, the first insulation layer 109, the first electrode layer 107, the second insulation layer 106 and the second electrode layer 108 are located at a side of the source/drain metal layer 105 away from the base substrate, and arranged in a direction away from the base substrate 101.

The first insulation layer 109 is formed between the source/drain metal layer 105 and the first electrode layer 107 to improve a protection effect on the active layer 104, in particular on the active layer 104 as a channel region of a thin film transistor. In the embodiments of the present disclosure, a thickness of the first insulation layer is 100 nm to 300 nm.

A via hole 1061 is formed in the second insulation layer 106 and penetrates through the second insulation layer 106 in a direction substantially perpendicular to the base substrate 101, and the first electrode layer 107 is electrically coupled to the source/drain metal layer 105 through the via hole 1061.

As shown in FIG. 4 to FIG. 8, in the embodiments of the present disclosure, the via hole 1061 penetrates through at least one of the second insulation layer 106 and the first insulation layer 109.

The display substrate in the embodiments of the present disclosure is mainly applied to an ADS type display device or an HADS type display device. A common electrode is located above a pixel electrode, the word "above" refers to that the common electrode is arranged at a side away from the base substrate 101 of the display substrate.

The source/drain metal layer 105 includes a data line pattern 1051, and the first electrode layer 107 is electrically coupled to the data line pattern 1051. The first electrode layer 107 includes the common electrode and the pixel electrode, the second electrode layer 108 includes a second electrode pattern 1081, a part of an orthogonal projection of the first electrode layer 107 onto the base substrate 101 overlaps an orthogonal projection of the second electrode pattern 1081 onto the base substrate 101, and the pixel electrode is electrically coupled to the data line pattern 1051 to obtain a data signal.

It should be appreciated that, in the related art, the first electrode layer is generally arranged between the gate insulation layer and the base substrate, that is, the first electrode layer is arranged at a same layer as the gate electrode layer. At least the gate insulation layer and the second insulation layer are arranged between the first electrode layer and the second electrode layer. In this way, there is a relatively large distance between the first electrode layer and the second electrode layer.

Through detection, the distance between the first electrode layer and the second electrode layer of the conventional display substrate is more than 1000 nm, so a pixel driving voltage Vop and logic power consumption of the display device are relatively high.

In the embodiments of the present disclosure, the first electrode layer 107 is arranged between the gate insulation layer 103 and the second insulation layer 106. As compared with the related art, the distance between the first electrode layer 107 and the second electrode layer 108 is reduced by at least a thickness of the gate insulation layer 103, so it is able to reduce the pixel driving voltage Vop as well as the logic power consumption of the display device, thereby to improve the performance of the display substrate.

In the embodiments of the present disclosure, the second insulation layer 106 is in direct contact with both the first electrode layer 107 and the second electrode pattern 1081, so a distance between the first electrode layer 107 and the second electrode pattern 1081 is a thickness of the second insulation layer 106. The thickness of the second insulation layer 106 is 200 nm to 800 nm, so the distance between the first electrode layer 107 and the second electrode pattern 1081 may be controlled to be 200 nm to 800 nm. As compared with the related art, the distance between the first electrode layer 107 and the second electrode pattern 1081 is significantly reduced, so it is able to reduce the pixel driving voltage and the logic power consumption of the pixel, and improve the transmittance of the display substrate, thereby to improve the performance of the display substrate.

The present disclosure further provides in some embodiments a method for manufacturing a display substrate.

In the embodiments of the present disclosure, the method includes: providing a substrate; forming a gate electrode layer, a gate insulation layer, an active layer and a source/drain metal layer on the base substrate; forming a first electrode layer at a side of the source/drain metal layer away from the base substrate; forming a second insulation layer at a side of the first electrode layer away from the base substrate; forming a via hole in the second insulation layer, the via hole penetrating through the first insulation layer and extending to the source/drain metal layer, so as to expose a part of a surface of the first electrode layer away from the base substrate and a part of a surface of the source/drain metal layer away from the base substrate; and forming a second electrode layer at a side of the second insulation layer away from the base substrate, the second electrode layer including a connection member, and the connection member being electrically coupled to the first electrode layer and the source/drain metal layer through the via hole.

The method in the embodiments of the present disclosure may be used to manufacture the above-mentioned display substrate with a same or similar technical effect, which will thus not be particularly defined herein.

Figure 6:
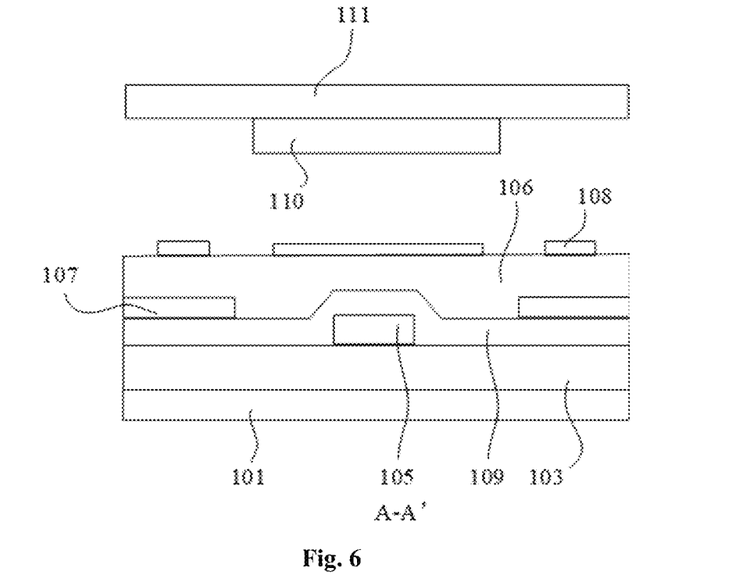
FIG. 6 is a sectional view of the display substrate along line A-A' in FIG. 5.
Figure 7:
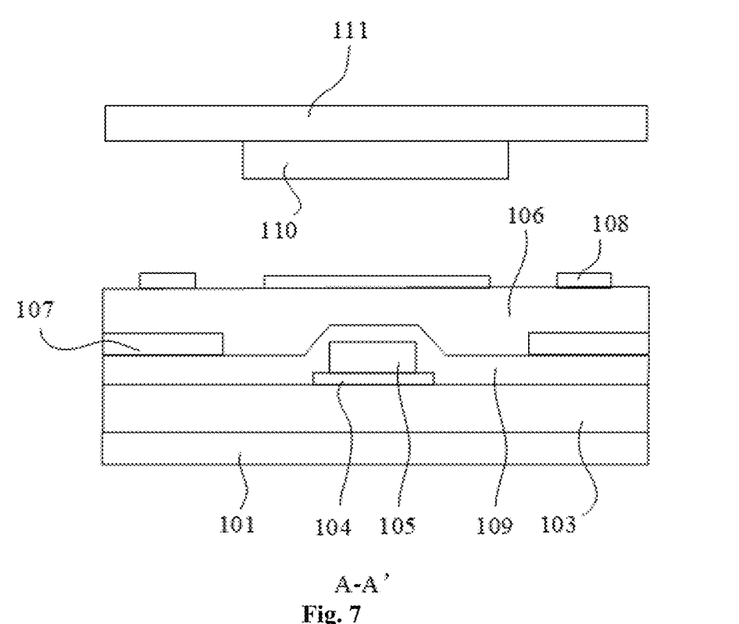
FIG. 7 is another sectional view of the display substrate along line A-A' in FIG. 5.
Figure 8:
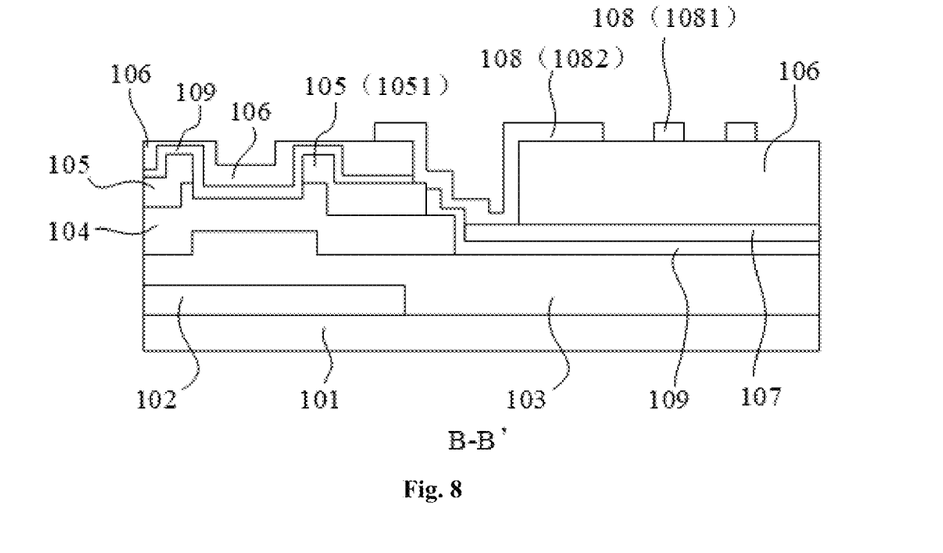
FIG. 8 is a sectional view of the display substrate along line B-B' in FIG. 5.

In the embodiments of the present disclosure, as shown in FIG. 6 to FIG. 8, the display substrate includes a base substrate 101, and a gate electrode layer 102, a gate insulation layer 103, an active layer 104, a source/drain metal layer 105, a first electrode layer 107, a second insulation layer 106 and a second electrode layer 108 laminated one on another on the base substrate 101.

As shown in FIG. 1 to FIG. 6 and FIG. 8, in the embodiments of the present disclosure, the display substrate is formed through six patterning processes.

Figure 1:
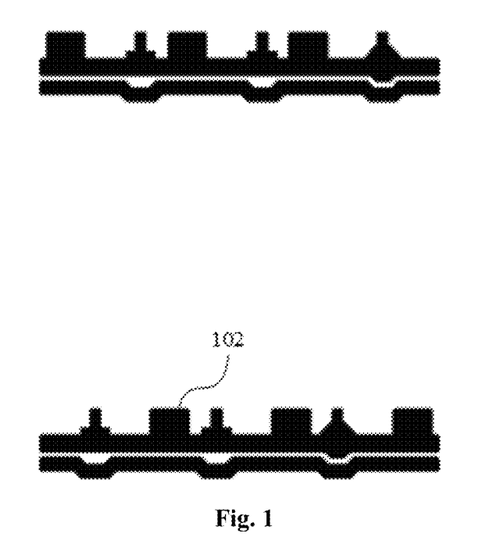
FIG. 1 is a schematic view showing the manufacture of a display substrate according to one embodiment of the present disclosure.
Figure 2:
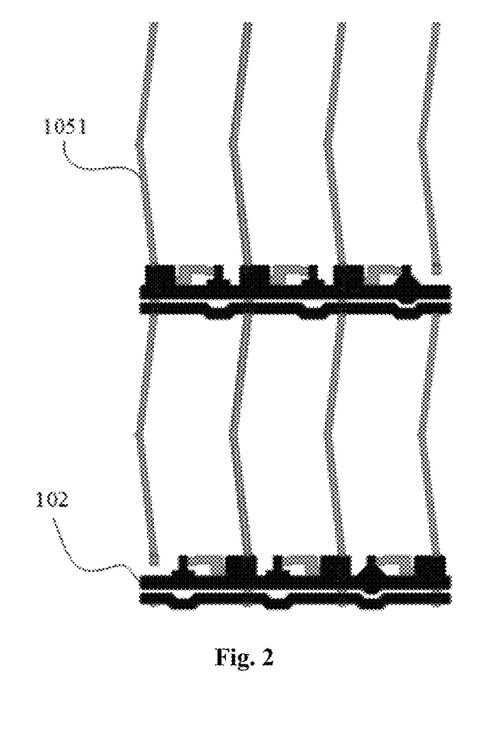
FIG. 2 is another schematic view showing the manufacture of the display substrate according to one embodiment of the present disclosure.

As shown in FIG. 1, during the manufacture, the gate electrode layer 102 is formed through a patterning process, and then an entire layer of the gate insulation layer 103 is formed, as shown in FIG. 2. Then, the active layer 104 and the source/drain metal layer 105 are formed through two separate patterning processes.

Figure 3:
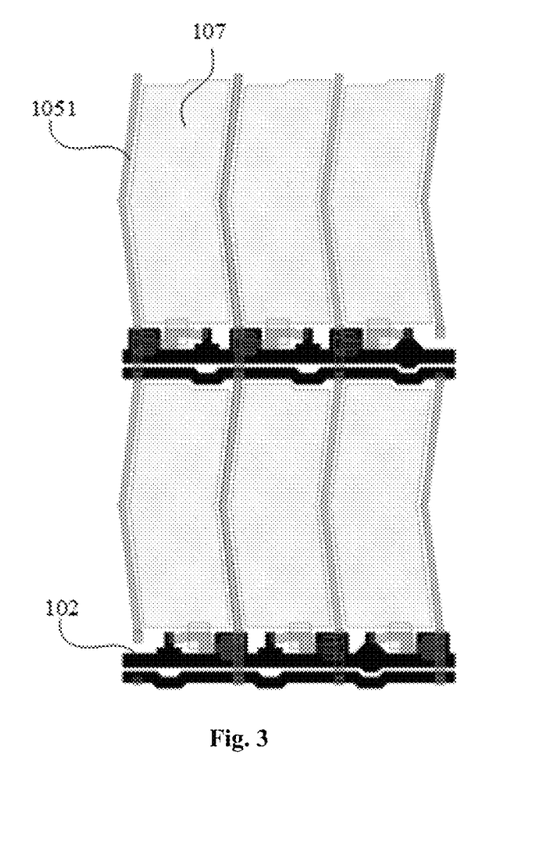
FIG. 3 is yet another schematic view showing the manufacture of the display substrate according to one embodiment of the present disclosure.
Figure 4:
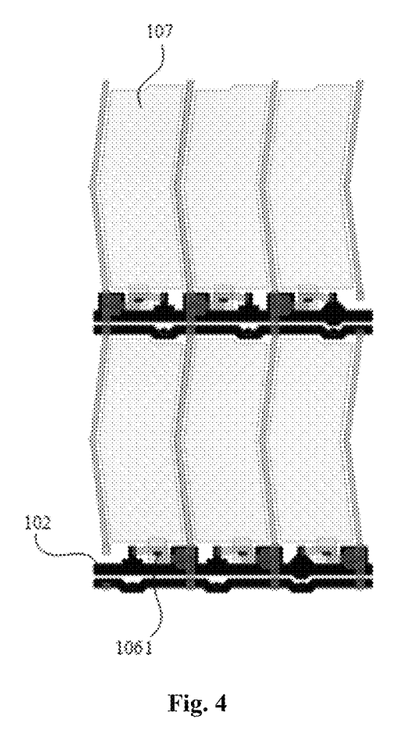
FIG. 4 is still yet another schematic view showing the manufacture of the display substrate according to one embodiment of the present disclosure.

Next, the first insulation layer 109 for the source/drain metal layer 105 is formed, as shown in FIG. 3, and the first electrode layer 107 is formed through a patterning process. As shown in FIG. 4, an entire layer of the second insulation layer 106 is formed, and a via hole 1061 is formed in the second insulation layer 106 through a patterning process.

The via hole 1061 is formed through a single patterning process so as to penetrate through both the second insulation layer 106 and the first insulation layer 109.

Figure 5:
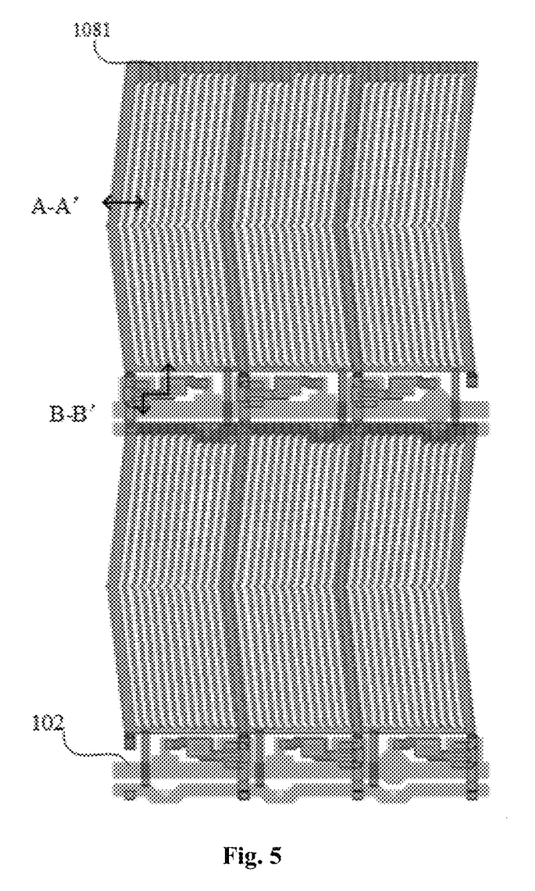
FIG. 5 is still yet another schematic view showing the manufacture of the display substrate according to one embodiment of the present disclosure.

As shown in FIG. 5, the second electrode layer 108 is finally formed through a patterning process. That is, the six patterning processes are used to form the first electrode layer 107, the gate electrode layer 102, the active layer 104, the source/drain metal layer 105, the second insulation layer 106 and the second electrode layer 108.

As shown in FIG. 5, FIG. 6 and FIG. 8 (FIG. 8 is a sectional view of a region where a thin film transistor is located), the active layer 104 and the source/drain metal layer 105 are formed though the two patterning processes, so the active layer 104 does not overlap the source/drain metal layer 105 at a region outside the thin film transistor, i.e., there is no active layer 104 at the region outside the thin film transistor.

As shown in FIG. 1 to FIG. 5, FIG. 7 and FIG. 8, in some other embodiments of the present disclosure, the display substrate is formed through five patterning processes. Different from FIG. 6, the active layer 104 and the source/drain metal layer 105 are formed through a single patterning process. As shown in FIG. 7, an orthogonal projection of the source/drain metal layer 105 onto the base substrate 101 overlaps an orthogonal projection of the active layer 104 onto the base substrate 101 at the region outside the thin film transistor.

As shown in FIG. 8, in the embodiments of the present disclosure, the first electrode layer 107 serves as a pixel electrode, an orthogonal projection of the data line pattern 1051 onto the base substrate 101 does not overlaps the orthogonal projection of the second electrode layer 108 onto the base substrate 101, the second electrode layer 108 includes a connection member 1082 and the second electrode pattern 1081 as a common electrode, an orthogonal projection of the connection member 1082 onto the base substrate 101 covers the orthogonal projection of the via hole 1061 onto the base substrate 101, and the first electrode layer 107 is electrically coupled to the data line pattern 1051 in the source/drain metal layer 105 through the connection member 1082.

To be specific, the orthogonal projection of the via hole 1061 onto the base substrate 101 overlaps an orthogonal projection of the first electrode layer 107 onto the base substrate 101 at a first overlapping region, and the orthogonal projection of the via hole 1061 onto the base substrate 101 overlaps an orthogonal projection of the source/drain metal layer 105 onto the base substrate 101 at a second overlapping region. That is, a part of a surface of each of the first electrode layer 107 and the source/drain metal layer 105 away from the base substrate 101 is exposed through the via hole 1061 penetrating through the second insulation layer 106. Next, the formed second electrode layer 108 includes the connection member 1082 to cover the region where the via hole 1061 is located. In this regard, the connection member 1082 is in contact with the exposed surfaces of the first electrode layer 107 and the source/drain metal layer 105, so as to enable the first electrode layer 107 to be electrically coupled to the source/drain metal layer 105 through the connection member 1082.

As shown in FIG. 9 to FIG. 14, in the embodiments of the present disclosure, the orthogonal projection of the data line pattern 1051 onto the base substrate 101 overlaps the orthogonal projection of the first electrode layer 107 onto the base substrate 101 at an overlapping region, and the data line pattern 1051 is in direct contact with the first electrode layer 107 at the overlapping region.

Figure 14:
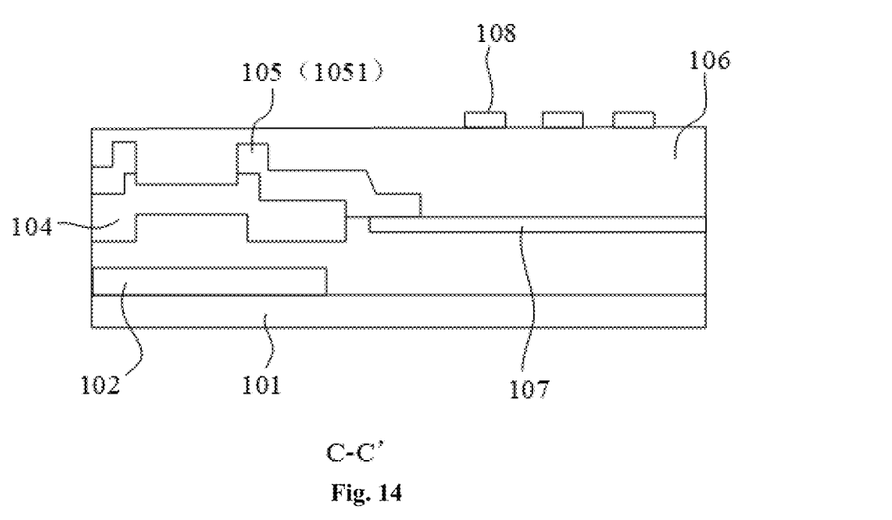
FIG. 14 is a sectional view of the display substrate along line C-C' in FIG. 13.

As shown in FIG. 14, the display substrate includes a base substrate 101, and a gate electrode layer 102, a gate insulation layer 103, an active layer 104, a source/drain metal layer 105, a second insulation layer 106 and a second electrode layer 108 laminated one on another on the base substrate 101.

The display substrate may be formed through five or six patterning processes.

Figure 9:
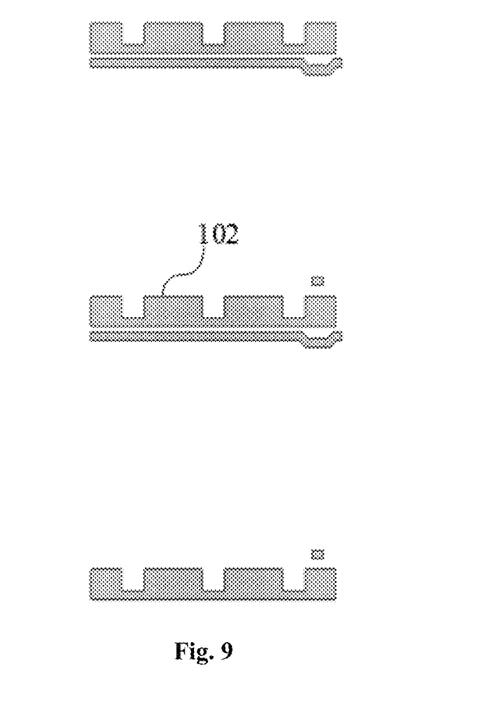
FIG. 9 is still yet another schematic view showing the manufacture of the display substrate according to one embodiment of the present disclosure.

As shown in FIG. 9, during the manufacture, the gate electrode layer 102 is formed through a patterning process, and then an entire layer of the gate insulation layer 103 is formed.

Figure 10:
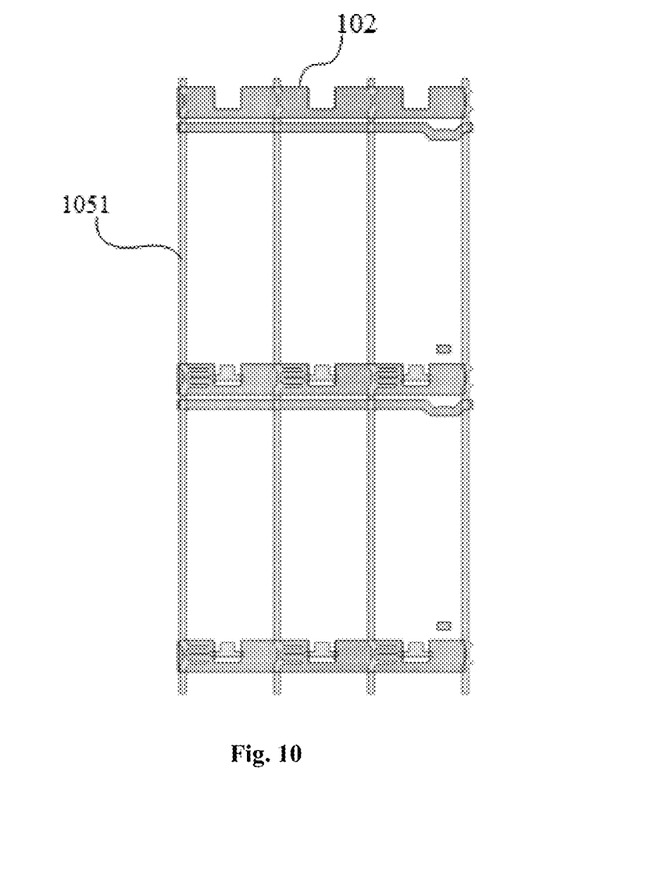
FIG. 10 is still yet another schematic view showing the manufacture of the display substrate according to one embodiment of the present disclosure.

As shown in FIG. 10, the active layer 104 and the source/drain metal layer 105 are formed through two separate patterning processes or through a single patterning process.

Figure 11:
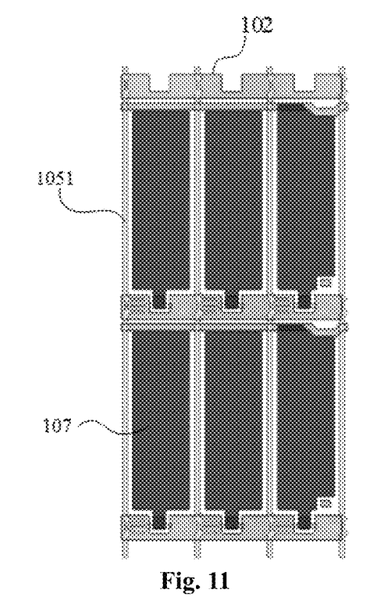
FIG. 11 is still yet another schematic view showing the manufacture of the display substrate according to one embodiment of the present disclosure.

As shown in FIG. 11, the first electrode layer 107 is formed through a patterning process.

When the active layer 104 and the source/drain metal layer 105 are formed through a single patterning process, the first electrode layer 107 may be formed before or after the formation of the active layer 104 and the source/drain metal layer 105.

When the active layer 104 and the source/drain metal layer 105 are formed through two patterning processes, the first electrode layer 107 may be formed before or after the source/drain metal layer 105.

The source/drain metal layer 105 is directly lapped onto the first electrode layer 107 to realize electrical connection.

As shown in FIG. 14, in the embodiments of the present disclosure, the active layer 104 is formed at first, then the first electrode layer 107 is formed, and then the source/drain metal layer 105 is formed. In this regard, a surface of the first electrode layer 107 away from the base substrate 101 is directly lapped onto a surface of the data line pattern 1051 close to the base substrate 101, thereby to realize electrical connection. It should be appreciated that, if the source/drain metal layer 105 is formed prior to the first electrode layer 107, the surface of the first electrode layer 107 close to the base substrate 101 is directly lapped onto the surface of the data line pattern 1051 away from the base substrate 101, so as to realize electrical connection.

Figure 12:
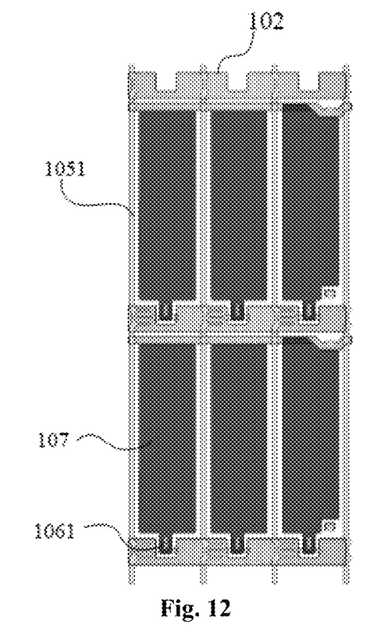
FIG. 12 is still yet another schematic view showing the manufacture of the display substrate according to one embodiment of the present disclosure.
Figure 13:
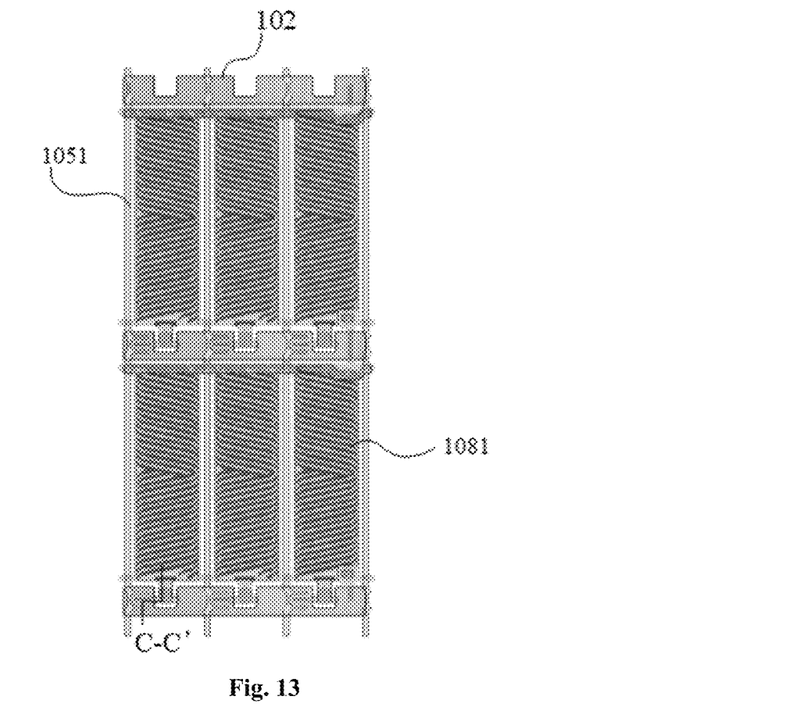
FIG. 13 is still yet another schematic view showing the manufacture of the display substrate according to one embodiment of the present disclosure.

As shown in FIG. 12, an entire layer of the second insulation layer 106 is formed, and the via hole 1061 is formed in the second insulation layer 106 through a patterning process. As shown in FIG. 13, the second electrode layer 108 is finally formed through a patterning process. That is, the six patterning processes are used to form the first electrode layer 107, the gate electrode layer 102, the active layer 104, the source/drain metal layer 105, the second insulation layer 106 and the second electrode layer 108.

The orthogonal projection of the data line pattern 1051 onto the base substrate 101 overlaps the orthogonal projection of the first electrode layer 107 onto the base substrate 101 at an overlapping region, and the data line pattern 1051 overlaps the first electrode layer 107 at the overlapping region. The display substrate may be formed through six patterning processes, i.e., the active layer 104 and the source/drain metal layer 105 are formed through two separate patterning processes, or the display substrate may be formed through five patterning processes, i.e., the active layer 104 and the source/drain metal layer 105 are formed a single patterning process.

As compared with the related art, the distance between the first electrode layer 107 and the second electrode layer 108 is smaller, so it is able to reduce the driving voltage and the logic power consumption.

In the conventional display substrate, the distance between the first electrode layer 107 and the second electrode layer 108 is greater than 800 nm. However, in the embodiments of the present disclosure, a minimum distance between the first electrode layer 107 and the second electrode layer 108 is 250 nm. As compared with the related art, the pixel driving voltage Vop is reduced from 5.6V to 4.0V, and the logic power consumption is reduced by about 20%.

In addition, in the case that the second electrode layer 108 is a fence-shaped common electrode, usually a grayscale image transmittance of a pixel structure varies along with a width of the second electrode layer 108. In this regard, in the case of a given fluctuation level of the grayscale image transmittance, it is able to reduce a line width of the second electrode 108.

A test result will be described hereinafter when the display substrate in FIG. 13 is an ADS display substrate.

In the related art, a line width of the second electrode layer 108 is about 81 μm, a width of a conductive pattern is about 2.6 μm, a distance between adjacent conductive patterns is about 5.4 μm, and a pixel driving voltage Vop is about 7.4V.

In a possible embodiment of the present disclosure, the line width of the second electrode layer 108 is reduced to 6.6 μm, the width of the conductive pattern is about 2.4 μm, the distance between adjacent conductive patterns is about 4.2 μm, and the pixel driving voltage Vop is about 7.1V. In another possible embodiment of the present disclosure, the line width of the second electrode layer 108 is reduced to 6.8 μm, the width of the conductive pattern is about 2.5 μm, the distance between adjacent conductive patterns is about 4.3 μm, and the pixel driving voltage Vop is about 6.9 V.

Figure 15:
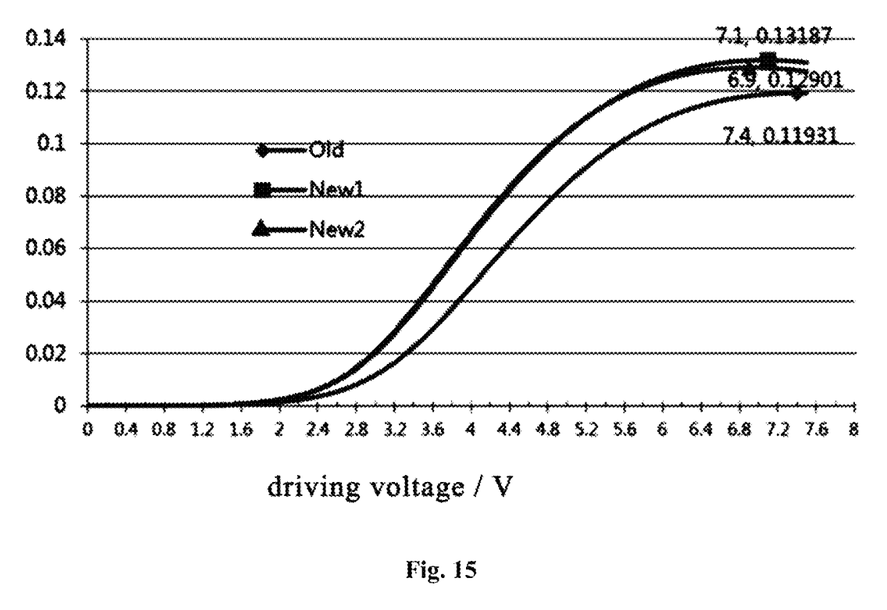
FIG. 15 is a curve diagram showing a transmittance of the display substrate according to one embodiment of the present disclosure.

In FIG. 15, an abscissa represents the driving voltage in volt (V), and an ordinate represents a transmittance increase ratio, where Old represents a test result of the conventional display substrate, and New1 and New2 are test results of the display substrates in two possible embodiments of the present disclosure. As shown in FIG. 14, as compared with the related art, in the case of a same driving voltage, the transmittance in the embodiments of the present disclosure is increased by about 10% when the line width of the second electrode layer 108 is reduced.

A plurality of gate lines arranged parallel to each other in a first direction and a plurality of data lines arranged parallel to each other in a second direction are formed on the base substrate 101, a minimum region enclosed by two adjacent gate lines and two adjacent data lines is a pixel region, the second electrode layer 108 includes a hollowed-out region 1082, an orthogonal projection of the hollowed-out region 1082 onto the base substrate 101 is located in the pixel region, the hollowed-out region 1082 includes a plurality of hollowed-out patterns arranged parallel to each other in a third direction, the first direction is perpendicular to the second direction, and the third direction intersects the first direction and the second direction.

Figure 16:
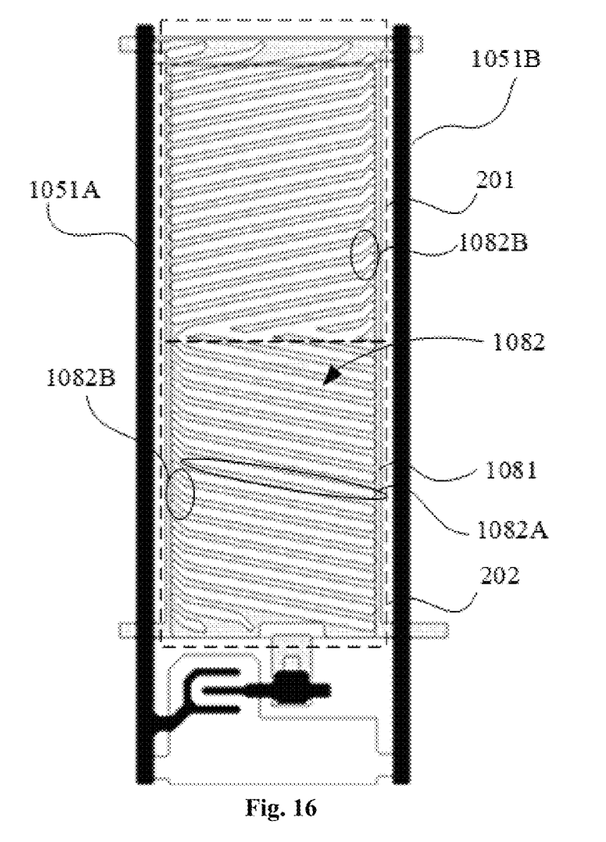
FIG. 16 is a schematic view showing the display substrate according to one embodiment of the present disclosure.

In FIG. 16, the first direction is a transverse direction, and the second direction is a longitudinal direction. The data line pattern 1051 in the source/drain metal layer 105 is used as a data line of the display substrate, and a first data line sub-pattern 1051A and a second data line sub-pattern 1051B are taken as two adjacent data lines for example.

The second electrode pattern 1081 of the second electrode layer 108 includes the hollowed-out region 1082, the hollowed-out region 1082 includes a plurality of separate hollowed-out patterns extending in the third direction. As shown in FIG. 16, the third direction is an oblique direction, i.e., the third direction intersects the first direction and the second direction.

In the embodiments of the present disclosure, the hollowed-out pattern includes a body member 1082A and a corner member 1082B, and the corner member 1082B is located on at least one of two sides of the pixel region close to the data line.

In the embodiments of the present disclosure, the pixel region defined by the first data line sub-pattern 1051A, the second data line sub-pattern 1051B, and two adjacent gate lines includes a first chip region 201 and a second chip region 202, and the first chip region 201 and the second chip region 202 are arranged in the second direction, i.e., the longitudinal direction in FIG. 16.

The corner member 1082B of the hollowed-out pattern in the first chip region 201 and the corner member 1082B of the hollowed-out pattern in the second chip region 202 are arranged at sides of the pixel region close to different data lines respectively.

As shown in FIG. 16, in the first chip region 201, the corner member 1082B is arranged close to a right side of the pixel region, and in the second chip region 202, the corner member 1082B is arranged close to a left side of the pixel region.

In the embodiments of the present disclosure, an angle between the corner member 1082B and an extension direction of the body member 1082A in the third direction is an acute angle within a range of 20° to 60°.

Figure 17:
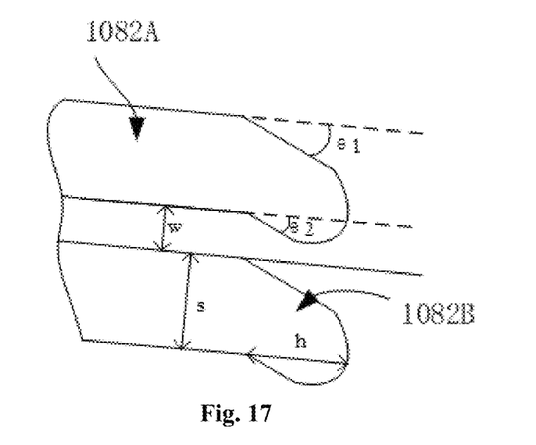
FIG. 17 is a topical schematic view showing a hollowed-out region according to one embodiment of the present disclosure.

As shown in FIG. 17, the angle between the corner member 1082B and the extension direction of the body member 1082A in the third direction refers to an angle θ1 or an angle θ2 in FIG. 17, and in each hollowed-out pattern, the angle θ1 and the angle θ2 may be equal or not.

In the embodiments of the present disclosure, a width of the hollowed-out pattern is a first size, a distance between two adjacent hollowed-out patterns is a second size, and a ratio of the first size to the second size is from 1.5 to 3.

Referring to FIG. 17 again, the width of the hollowed-out pattern refers to a size w of the hollowed-out pattern in a direction perpendicular to the third direction, and the distance between two adjacent hollowed-out patterns refers to a distance s between two adjacent hollowed-out patterns in the direction perpendicular to the third direction.

In a possible embodiment of the present disclosure, the first size w is 2.6 μm and the second size is 5.4 μm. In another possible embodiment of the present disclosure, the first size w is 2.4 μm and the second size is 4.2 μm. In yet another possible embodiment of the present disclosure, the first size w is 2.2 μm and the second size is 4.4 μm In the embodiments of the present disclosure, a linear distance between the corner member 1082B and the body member 1082A in the third direction is 2 μm to 6 μm. The linear distance between the corner member 1082B and the body member 1082A refers to a minimum distance h between an end of the corner member 1082B away from the body member 1082A and the body member 1082A in each hollowed-out pattern in the third direction.

In the embodiments of the present disclosure, the gate line is electrically coupled to the gate electrode layer 102, and the data line is electrically coupled to the source/drain metal layer 105.

The present disclosure further provides in some embodiments a display device including the above-mentioned display substrate. The display device includes the above-mentioned display substrate, so it at least has the above-mentioned technical effects, which will thus not be particularly defined herein.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, and a gate electrode layer, a gate insulation layer, an active layer and a source/drain metal layer laminated one on another on the base substrate, wherein the display substrate further comprises a first insulation layer, a first electrode layer, a second insulation layer and a second electrode layer laminated one on another, the first insulation layer is located at a side of the source/drain metal layer away from the base substrate, a via hole is formed in the second insulation layer, and the first electrode layer is electrically coupled to the source/drain metal layer through the via hole;

wherein the second electrode layer comprises a connection member, an orthogonal projection of the connection member onto the base substrate covers an orthogonal projection of the via hole onto the base substrate, and the connection member is electrically coupled to the source/drain metal layer and the first electrode layer;

wherein a plurality of gate lines arranged parallel to each other in a first direction and a plurality of data lines arranged parallel to each other in a second direction are formed on the base substrate, a minimum region enclosed by two adjacent gate lines and two adjacent data lines is a pixel region, the second electrode layer comprises a hollowed-out region, an orthogonal projection of the hollowed-out region onto the base substrate is located in the pixel region, the hollowed-out region comprises a plurality of hollowed-out patterns arranged parallel to each other in a third direction, the first direction is perpendicular to the second direction, and the third direction intersects the first direction and the second direction;

wherein the hollowed-out pattern comprises a body member and a corner member, and the corner member is located on at least one of two sides of the pixel region close to the data line;

wherein each pixel region comprises a first chip region and a second chip region arranged in the second direction, and the corner member of the hollowed-out pattern in the first chip region and the corner member of the hollowed-out pattern in the second chip region are arranged at sides of the pixel region close to different data lines respectively.

2. The display substrate according to claim 1, wherein the orthogonal projection of the via hole onto the base substrate overlaps an orthogonal projection of the first electrode layer onto the base substrate at a first overlapping region, the orthogonal projection of the via hole onto the base substrate overlaps an orthogonal projection of the source/drain metal layer onto the base substrate at a second overlapping region, and the connection member is electrically coupled to the first electrode layer at the first overlapping region and electrically coupled to the source/drain metal layer at the second overlapping region.

3. The display substrate according to claim 1, wherein a thickness of the first insulation layer is 100 nm to 300 nm.

4. The display substrate according to claim 1, wherein a thickness of the second insulation layer is 200 nm to 800 nm.

5. The display substrate according to claim 1, wherein an angle between the corner member and an extension direction of the body member in the third direction is an acute angle within a range from 20° to 60°.

6. The display substrate according to claim 1, wherein a width of the hollowed-out pattern is a first size, a distance between two adjacent hollowed-out patterns is a second size, and a ratio of the first size to the second size ranges from 1.5 to 3.

7. The display substrate according to claim 1, wherein a linear distance between the body member and the corner member in the third direction is 2 μm to 6 μm.

8. The display substrate according to claim 1, wherein the gate line is electrically coupled to the gate electrode layer, and the data line is electrically coupled to the source/drain metal layer.

9. A display device, comprising the display substrate according to claim 1.

10. A manufacturing method of a display substrate, configured to manufacture a display substrate, wherein the display substrate comprises:

a base substrate, and a gate electrode layer, a gate insulation layer, an active layer and a source/drain metal layer laminated one on another on the base substrate, wherein the display substrate further comprises a first insulation layer, a first electrode layer, a second insulation layer and a second electrode layer laminated one on another, the first insulation layer is located at a side of the source/drain metal layer away from the base substrate, a via hole is formed in the second insulation layer, and the first electrode layer is electrically coupled to the source/drain metal layer through the via hole;

wherein the second electrode layer comprises a connection member, an orthogonal projection of the connection member onto the base substrate covers an orthogonal projection of the via hole onto the base substrate, and the connection member is electrically coupled to the source/drain metal layer and the first electrode layer;

wherein a plurality of gate lines arranged parallel to each other in a first direction and a plurality of data lines arranged parallel to each other in a second direction are formed on the base substrate, a minimum region enclosed by two adjacent gate lines and two adjacent data lines is a pixel region, the second electrode layer comprises a hollowed-out region, an orthogonal projection of the hollowed-out region onto the base substrate is located in the pixel region, the hollowed-out region comprises a plurality of hollowed-out patterns arranged parallel to each other in a third direction, the first direction is perpendicular to the second direction, and the third direction intersects the first direction and the second direction;

wherein the hollowed-out pattern comprises a body member and a corner member, and the corner member is located on at least one of two sides of the pixel region close to the data line;

wherein each pixel region comprises a first chip region and a second chip region arranged in the second direction, and the corner member of the hollowed-out pattern in the first chip region and the corner member of the hollowed-out pattern in the second chip region are arranged at sides of the pixel region close to different data lines respectively;

wherein the manufacturing method comprises:

providing the base substrate;

forming the gate electrode layer, the gate insulation layer, the active layer and the source/drain metal layer on the base substrate;

forming the first electrode layer at a side of the source/drain metal layer away from the base substrate;

forming the second insulation layer at a side of the first electrode layer away from the base substrate;

forming the via hole in the second insulation layer, so as to expose a part of a surface of the first electrode layer away from the base substrate and expose a part of a surface of the source/drain metal layer away from the base substrate; and forming the second electrode layer at a side of the second insulation layer away from the base substrate, wherein the second electrode layer comprises the connection member, and the connection member is electrically coupled to the first electrode layer and the source/drain metal layer through the via hole.

11. The display device according to claim 9, wherein the orthogonal projection of the via hole onto the base substrate overlaps an orthogonal projection of the first electrode layer onto the base substrate at a first overlapping region, the orthogonal projection of the via hole onto the base substrate overlaps an orthogonal projection of the source/drain metal layer onto the base substrate at a second overlapping region, and the connection member is electrically coupled to the first electrode layer at the first overlapping region and electrically coupled to the source/drain metal layer at the second overlapping region.

12. The display device according to claim 9, wherein a thickness of the first insulation layer is 100 nm to 300 nm.

13. The display device according to claim 9, wherein a thickness of the second insulation layer is 200 nm to 800 nm.

* * * * *